(12) United States Patent
Takahashi

(10) Patent No.: US 7,391,841 B2
(45) Date of Patent: Jun. 24, 2008

(54) FREQUENCY SYNTHESIZER

(75) Inventor: Hisashi Takahashi, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 599 days.

(21) Appl. No.: 11/041,888

(22) Filed: Jan. 25, 2005

(65) Prior Publication Data
US 2005/0185750 A1 Aug. 25, 2005

(51) Int. Cl.
H03D 3/24 (2006.01)
H03L 7/00 (2006.01)

(52) U.S. Cl. .................................. 375/376; 327/144
(58) Field of Classification Search ................ 327/141, 327/162, 144–150, 155–157; 375/371, 373, 375/374–376
See application file for complete search history.

(56) References Cited

U.S. PATENT DOCUMENTS

| | | | | |
|---|---|---|---|---|
| 3,696,422 A * | 10/1972 | Burrell | .................. | 342/385 |
| 5,686,864 A * | 11/1997 | Martin et al. | .............. | 331/1 A |
| 6,072,371 A * | 6/2000 | Kobayashi et al. | ........... | 331/49 |
| 6,229,399 B1 * | 5/2001 | Tobise et al. | ................. | 331/17 |
| 6,525,615 B1 * | 2/2003 | Masenas et al. | .............. | 331/34 |
| 6,549,764 B2 * | 4/2003 | Welland | ..................... | 455/260 |

FOREIGN PATENT DOCUMENTS

| | | |
|---|---|---|
| JP | 11088164 | 3/1999 |
| JP | 11514511 | 12/1999 |
| JP | 2001016103 | 1/2001 |
| JP | 2002290235 | 10/2002 |
| WO | 9709786 | 3/1997 |

OTHER PUBLICATIONS

Japanese Office Action dated Apr. 11, 2006 with English translation.

* cited by examiner

Primary Examiner—Tesfaldet Bocure
(74) Attorney, Agent, or Firm—Dickinson Wright, PLLC

(57) ABSTRACT

A plurality of voltage controlled oscillators and a plurality of dividers are provided corresponding to a plurality of frequency bands, respectively, and a phase comparator, a charge pump, and a low pass filter are used in common for the plurality of frequency bands. A switch which selects any one of the plurality of voltage controlled oscillators, and a switch which selects any one of the plurality of dividers are provided. A controller which performs a gain control of a frequency synthesizer loop is further provided so that a gain characteristic of the frequency synthesizer loop comprised of a selected voltage controlled oscillator, selected divider, phase comparator, charge pump, and low pass filter becomes constant regardless of a selection change of the plurality of voltage controlled oscillators and the plurality of dividers.

11 Claims, 5 Drawing Sheets

FREQUENCY SYNTHESIZER

BACKGROUND OF THE INVENTION

1. Field of the Invention

The present invention relates to a frequency synthesizer capable of supporting multifrequency bands. The present invention also relates to a digital radio communication system capable of supporting a plurality of frequency bands, which transmit image and speech information using digital data.

2. Description of the Related Art

In recent years, with a multifrequency bands requirement of a digital radio communication system, a technique using a frequency synthesizer capable of supporting multifrequency bands has been proposed.

In addition, when a plurality of frequency synthesizers or the frequency synthesizer capable of supporting the multifrequency bands is used, a digital radio communication system capable of supporting multifrequency bands can be configured.

Hereafter, referring to FIG. 5 and Japanese Laid-Open Patent Application Publication No. 2002-290235, a configuration of the frequency synthesizer capable of supporting the multifrequency bands will be explained as a prior art.

FIG. 5 is a block diagram showing a high frequency unit of the prior art of the digital radio communication system which uses the frequency synthesizer capable of supporting the multifrequency bands.

In FIG. 5, intermediate-frequency voice data inputted from a voice data signal terminal 25 is modulated by a modulation unit 24 and is inputted into a frequency converting unit 23. In the frequency converting unit 23, using a local oscillation signal of a voltage controlled oscillator 28 of a first frequency synthesizer unit 29 or a local oscillation signal of a voltage controlled oscillator 30 of a second frequency synthesizer unit 31, the intermediate-frequency voice data are frequency-converted.

Here, the local oscillation signal of the voltage controlled oscillator 28 and the local oscillation signal of the voltage controlled oscillator 30 have different frequencies. A selection whether the voltage controlled oscillator 28 is used or the voltage controlled oscillator 30 is used is performed by a switch 27. Meanwhile, a local oscillation signal selected by the switch 27 is inputted into the frequency converting unit 23 through a switch 26 for switching transmission and reception.

An output signal of the frequency converting unit 23 is then amplified to a specified output power level by a driver unit (DRV) 22 and a power amplifier unit (PA) 21. An output signal of the power amplifier unit 21 is transmitted from an antenna 19 through a switch 20 for switching transmission and reception. At this time, multifrequency bands can be supported based on switching to the local oscillation signal of the voltage controlled oscillator 28 or the local oscillation signal of the voltage controlled oscillator 30, each of which has different frequency.

The switch 20 switches between a state of supplying the output of the power amplifier unit 21 to the antenna 19 as a transmission signal and a state of supplying a signal received by the antenna 19 to a front-end unit 32.

When the received signal is inputted through the switch 20 from the antenna 19, the received signal enters the front-end unit 32. In the front-end unit 32, a desired received signal is amplified, selected by a filter, which is not shown, and is inputted into a frequency converting unit 33.

The received signal inputted into the frequency converting unit 33 is frequency-converted using the local oscillation signal of the voltage controlled oscillator 28 or the local oscillation signal of the voltage controlled oscillator 30. A selection whether the voltage controlled oscillator 28 is used or the voltage controlled oscillator 30 is used is performed by a switch 27. A local oscillation signal selected by the switch 27 is then inputted into the frequency converting unit 33 through the switch 26 for switching transmission and reception.

An intermediate-frequency received signal converted by the frequency converting unit 33 is demodulated by a demodulation unit 34 and is outputted from a voice data signal terminal 35 as an audio signal.

Here, in the digital radio communication system which performs a transmission of the transmission signal and a transmission of the received signal alternately, the local oscillation signal is switched for the transmission signal or for the received signal by the switch 26, and inputted into the frequency converting unit 23 or the frequency converting unit 33.

Meanwhile, according to a frequency synthesizer disclosed by Japanese Laid-Open Patent Application Publication No. 2002-290235, it includes a plurality of prescalers, a plurality of multipliers, and a switching unit, wherein an output signal of the multiplier is used as a local oscillation signal, and a combination of a desired prescaler and multiplier is set so that a product of a division ratio and a multiplication number may become constant. According to this configuration, a variable frequency step of a synthesizer output frequency can be kept at a constant value regardless of a frequency band to be selected. In addition, according to this frequency synthesizer, a prescaler which is not selected by switching a plurality of prescalers is turned off, thereby achieving a reduction in power dissipation.

However, in the digital radio communication system using the frequency synthesizer capable of supporting the multifrequency bands shown in FIG. 5, a frequency synthesizer unit is individually needed for each of a plurality of frequency bands, resulting in a problem of an increase in mounting area of the frequency synthesizer unit.

Meanwhile, another prior art is disclosed in the Japanese Laid-Open Patent Application Publication No. 2002-290235. However, according to this prior art, a plurality of multipliers are needed, resulting in a problem of an increase in mounting area and an increase in power consumption of the multiplier.

In a configuration in which the output of the voltage controlled oscillator is used as the local oscillation signal not by using the multiplier but by varying the division ratio of the divider, a loop gain characteristics of the frequency synthesizer unit is different for every different oscillation frequency. As a result, there may arise a problem that a difference will occur in a lock-up time characteristic and a C/N characteristic, which are frequency synthesizer characteristics.

SUMMARY OF THE INVENTION

An object of the present invention is to provide a frequency synthesizer and a digital radio communication system which can reduce a mounting area and can achieve a reduction in power consumption.

Moreover, another object of the present invention is to provide a frequency synthesizer which can provide the same loop gain characteristic even when a frequency band is switched.

In order to solve the problem described above, a frequency synthesizer of the present invention includes a plurality of voltage controlled oscillators which are individually provided according to a plurality of frequency bands and oscillate at a frequency corresponding to an external voltage, a first frequency-dividing unit which divides an output signal of the plurality of voltage controlled oscillators, a reference oscillator provided in common for the plurality of frequency bands, a phase comparison unit which is provided in common for the plurality of frequency bands, and performs a phase comparison between a signal obtained from the first frequency-dividing unit and a signal obtained from the reference oscillator to output an error signal, a low pass filter which is provided in common for the plurality of frequency bands, and integrates an output signal of the phase comparison unit to provide it to the voltage controlled oscillator as the external voltage, a voltage controlled oscillator selection unit which selects any one of the plurality of voltage controlled oscillators corresponding to a selection of the frequency band, and a controlling unit which performs a gain control of a frequency synthesizer loop in synchronizing with a selection change of the plurality of voltage controlled oscillators so that a gain characteristic of the frequency synthesizer loop comprised of any one of the plurality of voltage controlled oscillators, the first frequency-dividing unit, the phase comparison unit, and the low pass filter may become constant regardless of the selection change of the plurality of voltage controlled oscillators.

According to this configuration, the voltage controlled oscillator is individually provided for every frequency band, the voltage controlled oscillator selection unit selects any one of them, and other elements, such as a phase comparator and the low pass filter are used in common for the plurality of frequency bands. For that reason, as compared with providing the frequency synthesizer individually for every frequency band, a mounting area can be reduced and a reduction in power consumption can be achieved.

Moreover, the gain control of the frequency synthesizer loop is performed in synchronizing with the selection change of the plurality of voltage controlled oscillators by the controlling unit so that the gain characteristic of the frequency synthesizer loop may become constant, thereby making it possible to provide the same loop gain characteristic of the frequency synthesizer regardless of the selection change of the voltage controlled oscillators.

In the frequency synthesizer of the present invention, preferably it further includes a frequency-dividing unit selecting unit, wherein a plurality of the first frequency-dividing units are provided corresponding to the plurality of frequency bands, and any one of the plurality of first frequency-dividing units is selected associated with the selection of the frequency band by the frequency-dividing unit selecting unit.

According to this configuration, a frequency characteristic and a consumed electric current of the first frequency-dividing unit can optimally be set for every frequency band.

Moreover, in the frequency synthesizer of the present invention, it preferably includes a second frequency-dividing unit between the reference oscillator and the phase comparison unit.

According to this configuration, when changing a division ratio of the first frequency-dividing unit for a gain control, a change in oscillation frequency of the voltage controlled oscillator caused by it can be avoided by a control of a division ratio of the second frequency-dividing unit.

Moreover, in the frequency synthesizer of the present invention, as a gain control of the frequency synthesizer loop, the controlling unit preferably performs a gain control of, for example, at least either of the plurality of voltage controlled oscillators or the phase comparison unit.

Moreover, in the frequency synthesizer of the present invention, when there is provided a charge pump between the phase comparison unit and the low pass filter, the controlling unit may perform a gain control of the charge pump as the gain control of the frequency synthesizer loop.

Meanwhile, instead of performing the gain control by the voltage controlled oscillator, the phase comparator, or the charge pump, an amplifier with variable gain is provided and the gain is controlled, so that the gain control of the frequency synthesizer loop may be performed.

In addition, when the second frequency-dividing unit is provided, the controlling unit can perform a division ratio control of the first frequency-dividing unit as the gain control of the frequency synthesizer loop, and control a division ratio of the second frequency-dividing unit so as to compensate a frequency change of the output signal of the plurality of voltage controlled oscillators associated with the division ratio control of the first frequency-dividing unit.

In addition, when the second frequency-dividing unit is provided, as the gain control of the frequency synthesizer loop, the controlling unit controls the division ratio of the second frequency-dividing unit in a state of keeping constant gains of the plurality of voltage controlled oscillators, and the phase comparison unit and the division ratio of the first frequency-dividing unit, so that it can also set frequencies of the output signals of the plurality of voltage controlled oscillators to predetermined frequencies, respectively, while keeping constant the gain characteristic of the frequency synthesizer loop.

In the frequency synthesizer of the present invention described above, the voltage controlled oscillator selection unit includes, for example a first selector which selectively provides an output of the low pass filter to the plurality of voltage controlled oscillators, and a second selector which selectively outputs an output of the plurality of voltage controlled oscillators. Moreover, the frequency-dividing unit selecting unit includes, for example a third selector which selectively provides an output of the second selector to the plurality of first frequency-dividing units, and a fourth selector which selectively outputs an output of the plurality of first frequency-dividing units.

According to this configuration, a power supply to a non-selected voltage controlled oscillator among the plurality of voltage controlled oscillators and a power supply power to a non-selected first frequency-dividing unit among the plurality of first frequency-dividing units are preferably interrupted. The only power supply to either of the voltage controlled oscillator or the first frequency-dividing unit may be interrupted.

According to this configuration, consumption of useless electric power by the non-selected voltage controlled oscillator and the non-selected first frequency-dividing unit can be eliminated.

Moreover, in the frequency synthesizer described above, when the first frequency-dividing unit is individually provided for every frequency band, the first frequency-dividing unit preferably has a frequency characteristic according to a shared frequency band among the plurality of frequency bands. In this case, when the shared frequency band is higher, the first frequency-dividing unit needs a circuit configuration having higher power consumption in order to be properly operated in that frequency band but, on the contrary.

According to this configuration, a characteristic of the first frequency-dividing unit to be used for a low frequency band is set to a characteristic according to the frequency band, so that power consumption of the first frequency-dividing unit to be used for the low frequency band can be reduced. As a result, as compared with sharing the first frequency-dividing unit for the plurality of frequency bands, consumption of useless electric power can be eliminated.

The digital radio communication system of the present invention has a configuration provided with the frequency synthesizer of the present invention described above.

According to this configuration, the function and effect similar to that of the frequency synthesizer of the present invention can be provided.

As described above, according to the frequency synthesizer of the present invention, a reduction in mounting area and a reduction in power consumption can be achieved, and the frequency synthesizer, the loop gain characteristic of which is constant (the same) for all frequency bands, and which supports the multifrequency bands can further be obtained.

DETAILED DESCRIPTION OF THE PREFERRED EMBODIMENTS

Figure 1:
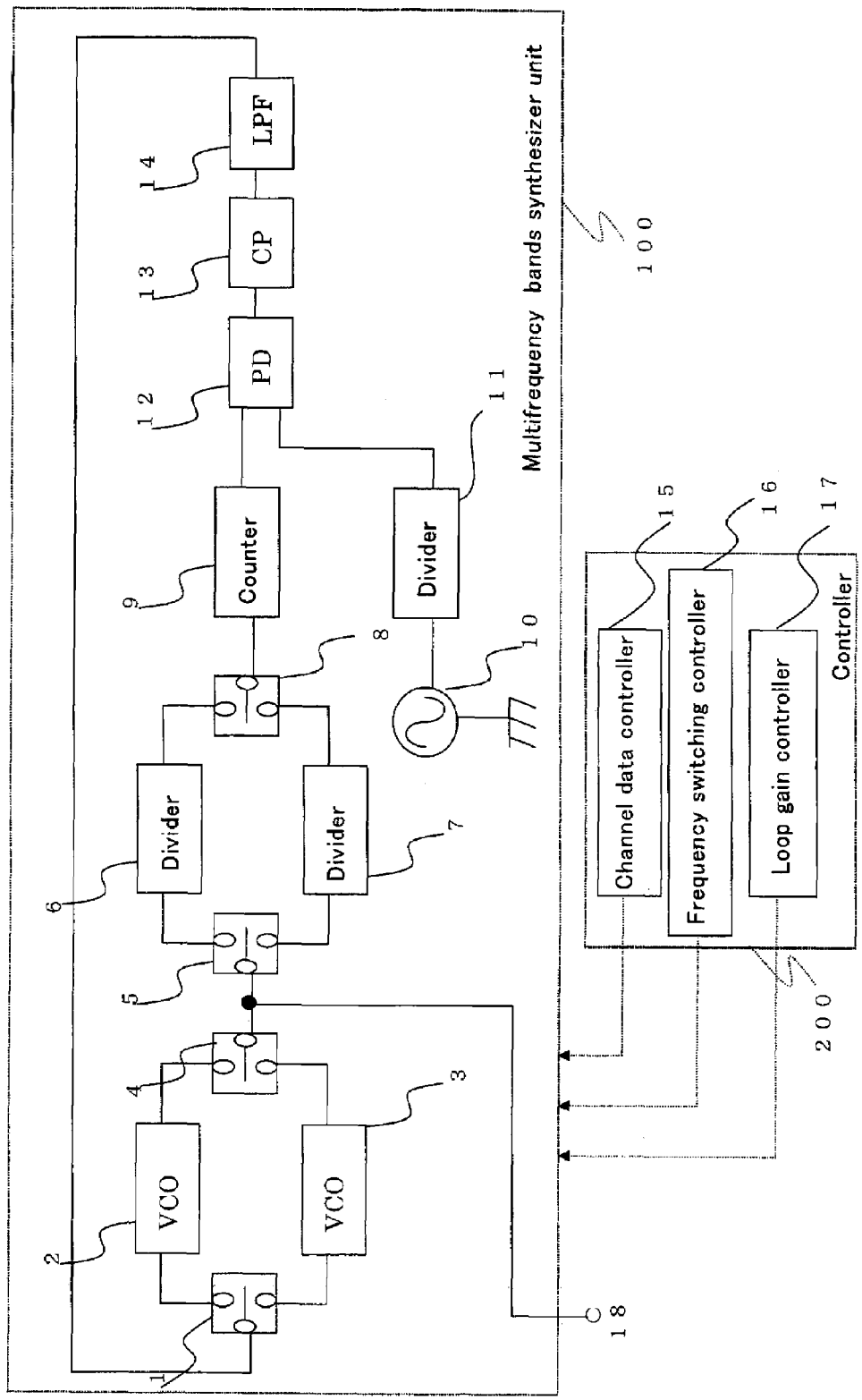
FIG. 1 is a block diagram showing a configuration of a frequency synthesizer according to a first embodiment of the present invention.

Hereafter, referring to the drawings, embodiments of the present invention will be explained.

First Embodiment

Hereafter, a frequency synthesizer according to a first embodiment of the present invention will be explained using FIG. 1.

A switch 1 selectively inputs an output of a low pass filter 14 into a plurality of voltage controlled oscillators 2 and 3 (in this example, two). The voltage controlled oscillator 2 and the voltage controlled oscillator 3 have different frequency characteristics and operate at different frequency bands. A switch 4 selectively supplies outputs of the plurality of voltage controlled oscillators 2 and 3 to a voltage controlled oscillator output terminal 18. A switch 5 selectively inputs an oscillation signal of either of the voltage controlled oscillators 2 or 3 selected by the switch 4 to any one of a plurality of dividers 6 and 7 (in this example, two). The divider 6 and the divider 7 compose a first frequency-dividing unit, correspond to operating frequency bands of the voltage controlled oscillators 2 and 3, respectively, and have different frequency characteristics and power consumptions. A switch 8 selectively inputs outputs of the two dividers 6 and 7 into a counter 9 which composes the first frequency-dividing unit. Meanwhile, a divider 11 which composes a second frequency-dividing unit divides an output signal of a reference oscillator 10. The dividers 6 and 7 having different frequency characteristics and power consumptions are switched, so that the power consumption is optimally controlled.

A phase comparator 12 detects a phase error between an output signal (divided output signal at the reference side) of the divider 11 and an output signal of the counter 9. A charge/discharge current according to the phase error of the phase comparator 12 is made to flow by a charge pump 13. The low pass filter 14 integrates the charge/discharge current from the charge pump 13, and converts it into a DC voltage to input into the switch 1.

A multifrequency bands synthesizer unit 100 is composed of the elements described above.

A controller 200 of the frequency synthesizer of the present invention controls the multifrequency bands synthesizer unit 100 described above, and includes a channel data controller 15 which sets channel data of a lock frequency of the frequency synthesizer, a frequency switching controller 16 which switches frequency bands, and a loop gain controller 17 of the frequency synthesizer.

Next, operation of the controller 200 will be explained. First, control data corresponding to a desired frequency band is set by the frequency switching controller 16. Thereby, the switch 1 and the switch 4 are switched and a desired voltage controlled oscillator of either of the voltage controlled oscillators 2 or 3 is selected. Simultaneously, the switch 5 and the switch 8 are switched and a desired divider of either of the desired dividers 6 or 7 is selected.

Next, a desired frequency channel data which the frequency synthesizer locks is set to the selected divider among the dividers 6 and 7, the counter 9, and the divider 11 by the channel data controller 15. A division ratio of the divider 11 can be changed according to a change in channel data regardless of a band switching. Incidentally, as will be explained in the following, in order to make constant a PLL loop gain, constants $K_V$, $K_{PD}$, $K_{CP}$, M, N are changed, but in order to make constant a value of M×N, the division ratio of the divider 11 may be changed.

The control data is then set to a frequency synthesizer loop by the loop gain controller 17 so that a loop gain may always be kept constant in a selected frequency. Explanation will be specifically made in the following. When the plurality of voltage controlled oscillators 2 and 3, and the plurality of dividers 6 and 7 are switched, respectively, and oscillation frequencies of the voltage controlled oscillators 2 and 3 are set, according to respective switching operations, the loop gain controller 17 in FIG. 1 collectively perform a (gain) control to each block which determines a PLL loop gain (an oscillation gain $K_V$ of the voltage controlled oscillator 2 or 3, a gain $K_{PD}$ of the phase comparator 12, a gain $K_{CP}$ of the charge pump 13, a division ratio M of the divider 6 or 7, a division ratio N of the counter 9) so that the PLL loop gain may always be kept constant. That is, the gain control of each PLL loop is performed so that the PLL loop gains may become the same, even when the frequency bands are switched. That makes it possible to keep a constant C/N characteristic and lock-up characteristic, even when a plurality of different frequency bands (for example, one frequency band has, for example two or one half times frequency ratio relative to other frequency band) are switched. Incidentally, a gain change within the same frequency band by channel switching is so minute that it can be ignored.

Here, when the voltage controlled oscillator 2 and the divider 6 are selected, a first frequency synthesizer unit PLL1 is composed. The oscillation frequency of the voltage controlled oscillator 2 at this time is represented by equation (1). Here, symbol fout1 represents an oscillation frequency of the voltage controlled oscillator 2. Symbol $M_1$ represents a division ratio of the divider 6. Symbol $N_1$ represents a division ratio of the counter 9. Symbol fref represents a frequency of the reference oscillator 10. Symbol $N_3$ represents the division ratio of the divider 11.

Meanwhile, when the voltage controlled oscillator 3 and the divider 7 are selected, a second frequency synthesizer unit PLL2 is composed. The oscillation frequency of the voltage controlled oscillator 3 at this time is represented by equation (2). Here, symbol fout2 represents an oscillation frequency of the voltage controlled oscillator 3. Symbol $M_2$ represents a division ratio of the divider 7. Symbol $N_2$ represents a division ratio of the counter 9. Symbol fref represents a frequency of the reference oscillator 10. Symbol $N_4$ represents a division ratio of the divider 11.

$$fout1 = M_1 \times N_1 \times fref/N_3 \quad (1)$$

$$fout2 = M_2 \times N_2 \times fref/N_4 \quad (2)$$

At this time, respective values in equations represented above have a following relation. Here, since the oscillation frequency fout1 and the oscillation frequency fout2 have a frequency relationship that one voltage controlled oscillator can not deal with them, it is composed of a manner of switching between the two voltage controlled oscillators 2 and 3.

fout1 ≠ fout2
$M_1 \neq M_2$
$N_1 \neq N_2$
$N_3 \neq N_4$

Next, a loop gain when selecting the voltage controlled oscillator 2 and the divider 6 is represented by equation (3). Here, symbol $K_1$ represents a loop gain of the first frequency synthesizer unit PLL1. Symbol $K_{v1}$ represents an oscillation gain of the voltage controlled oscillator 2. Symbol $K_{PD1}$ represents a gain of the phase comparator 12. Symbol $K_{CP1}$ represents a gain of the charge pump 13. Symbol $M_1$ represents a division ratio of the divider 6. Symbol $N_1$ represents a division ratio of the counter 9. Symbol α represents a control parameter for always keeping constant the loop gain.

In addition, a loop gain when selecting the voltage controlled oscillator 3 and the divider 7 is represented by equation (4). Here, symbol $K_2$ represents a loop gain of the second frequency synthesizer unit PLL2. Symbol $K_{v2}$ represents an oscillation gain of the voltage controlled oscillator 3. Symbol $K_{PD2}$ represents a gain of the phase comparator 12. Symbol $K_{CP2}$ represents a gain of the charge pump 13. Symbol $M_2$ represents a division ratio of the divider 7. Symbol $N_2$ represents a division ratio of the counter 9. Symbol β represents a control parameter for always keeping constant the loop gain.

$$K_1 = \alpha \times (K_{v1} \times K_{PD1} \times K_{CP1})/(M_1 \times N_1) \quad (3)$$

$$K_2 = \beta \times (K_{v2} \times K_{PD2} \times K_{CP2})/(M_2 \times N_2) \quad (4)$$

At this time, between the loop gain of the first frequency synthesizer unit PLL1 and the loop gains of second frequency synthesizer unit PLL2, in order to make equal them as represented by following equation (5), the loop gain controller 17 sets the control parameter α in the first frequency synthesizer unit PLL1, or the control parameter β in the second frequency synthesizer unit PLL2.

$$K_1 = K_2 \quad (5)$$

Here, how to set the control parameters α and β will be explained. When respective oscillation frequencies are set as fout1 and fout2, respective PLL loop gains are typically provided as follows.

$$K_1 = (K_{v1} \times K_{PD1} \times K_{CP1})/(M_1 \times N_1)$$

$$K_2 = (K_{v2} \times K_{PD2} \times K_{CP2})/(M_2 \times N_2)$$

In this case, when those equations are calculated as they are, since the above setting constants are different, respectively, the values of the loop gains $K_1$ and $K_2$ become different from each other. Therefore, a loop gain value is determined in advance ($K_1 = K_2 =$ a certain constant value). A control change of any of the above constants $K_{v1}$, $K_{PD1}$, $K_{CP1}$, $M_1$, $N_1$ is performed so that the loop gain value that has been determined in advance may be obtained when the oscillation frequency is fout1. Moreover, a control change of any of the above constants $K_{v2}$, $K_{PD2}$, $K_{CP2}$, $M_2$, $N_2$ is performed so that the loop gain value that has been determined in advance may be obtained when the oscillation frequency is fout2. The summarized values of the constants of the change controls at that time are α when the oscillation frequency is fout1, and β when the oscillation frequency is fout2.

However, since the frequency fout1 will change when the constants $M_1$ and $N_1$ are changed, in order to compensate the change, it is also required to change the constant $N_3$ together.

Moreover, supplying power to a non-selected voltage controlled oscillator among the plurality of voltage controlled oscillators 2 and 3, and supplying power to a non-selected divider among the plurality of dividers 6 and 7 are interrupted, so that a reduction in power consumption can be achieved. Incidentally, even when supplying power to either of the non-selected voltage controlled oscillator or the non-selected divider is only interrupted, a reduction in power consumption can be achieved.

According to this first embodiment, the synthesizer capable of supporting the multifrequency bands can be achieved by switching between the plurality of voltage controlled oscillators 2 and 3, and switching between the plurality of dividers 6 and 7, and further the loop gain always is kept constant even when the frequency band is switched, so that the frequency synthesizer characteristics in respective frequency bands are kept constant.

In addition, according to this first embodiment, although the switching between the plurality of voltage controlled oscillators 2 and 3, and between the plurality of dividers 6 and 7 are individually provided for every frequency band, elements other than those are used in common for all frequency bands, so that a reduction in mounting area and a reduction in power consumption can be achieved.

Second Embodiment

Figure 2:
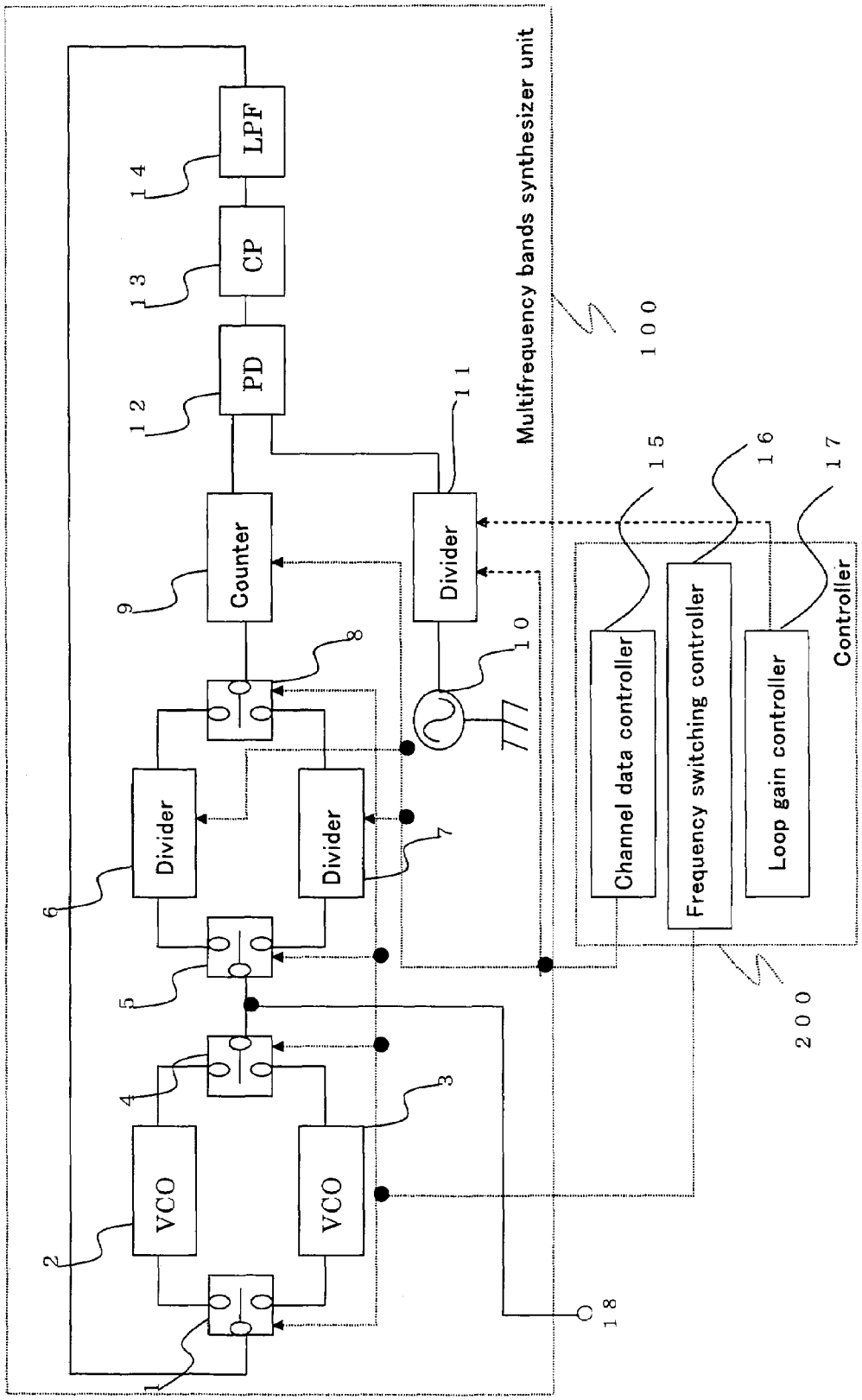
FIG. 2 is a block diagram showing a configuration of a frequency synthesizer according to a second embodiment of the present invention.

Hereafter, a frequency synthesizer according to a second embodiment of the present invention will be explained using FIG. 2.

In this second embodiment, a lock frequency of the frequency synthesizer is set in a manner similar to that of the first embodiment. Further, in addition to the configuration of the first embodiment, the loop gain controller 17 performs a switching control of a reference division ratio so that a loop gain may be kept constant even when the plurality of voltage controlled oscillators and the plurality of dividers are switched by switching the frequency band. When explaining this specifically, the PLL loop gain is controlled so as to keep constant by a switching control of only the division ratio of the divider 11 which divides the output signal of the reference oscillator 10.

In the first embodiment described above, the PLL loop gain has been controlled so as to keep constant by varying any of the parameter that determines the PLL loop gain, in other words, by controlling the control parameters α and β.

In this second embodiment, as a more concrete configuration, in order to control the gain to keep constant, the switching control of only the reference division ratio is performed.

That is, when switching the frequency band by switching the voltage controlled oscillators 2 and 3, the gains of the voltage controlled oscillators 2 and 3, the phase comparator 12, and the charge pump 13 are not changed but are made the same, and the division ratios of the dividers 6 and 7 and the counter 9 are not changed but are kept the same, so that only the division ratio of the divider 11 is changed according to the frequency band. This makes it possible to keep constant (the same) the gain characteristics of the PLL synthesizer loop irrespective of the switching of the frequency band. In other words, in order to set the frequencies of the output signals of the plurality of voltage controlled oscillators to predetermined frequencies, respectively, the division ratios of the dividers 6 and 7 or the counter 9 are not changed, but the division ratio of the divider 11 is changed. By doing in this way, a change in the PLL loop gain characteristic inevitably produced by switching the division ratios of the dividers 6 and 7 or the counter 9 for switching the frequency band can be eliminated.

Here, an example of the switching control of the reference division ratio will be explained. Supposing that a relation of following equations (6), (7), and (8) is held between the oscillation frequency fout1 of the first frequency synthesizer unit PLL1 and the oscillation frequency fout2 of the second frequency synthesizer unit PLL2.

$$fout1 = a \times M \times N \times fref/Nref \quad (6)$$

$$fout2 = M \times N \times fref/Nref \quad (7)$$

$$fout1 = a \times fout2 \quad (8)$$

However, symbol M represents a division ratio of the dividers 6 and 7. Symbol N represents a division ratio of the counter 9. Symbol Nref represents a division ratio of the divider 11. Symbol a represents a coefficient.

At this time, the reference division ratio is controlled as follows. The loop gain of the first frequency synthesizer unit PLL1 and the PLL loop gain of the second frequency synthesizer unit PLL2 are kept constant (the same) as shown by equation (9). For that purpose, the respective gains of the voltage controlled oscillator 2 or 3, the phase comparator 12, and the charge pump 13, and the division ratios M×N of the divider 6 or 7 and the counter 9 in the first frequency synthesizer unit PLL1 and the second frequency synthesizer unit PLL2 are controlled to always keep constant.

When explaining this specifically, in the oscillation frequencies fout1 and fout2, the respective gains of the voltage controlled oscillator 2 or 3, the phase comparator 12, and the charge pump 13 have the same value, and when switching between the voltage controlled oscillators 2 and 3 in varying the frequency of the voltage controlled oscillator 2 or 3, a variable control or a switching control of the division ratio of the reference frequency, that is, the division ratio of the divider 11 is performed so that the division ratios M×N of the divider 6 or the 7 and the counter 9 may always be kept constant.

$$K_1 = K_2 = (K_{v1} \times K_{PD1} \times K_{CP1})/(M \times N) \quad (9)$$

Here, since the division ratios M×N are always kept constant from equations (6), (7), and (8), equation (6) is transformed into equation (10).

$$fout1 = a \times M \times N \times fref/Nref = M \times N \times (a \times fref/Nref) \quad (10)$$

That is, according to equation (8), which represents a relation between the voltage controlled oscillation frequencies fout1 and fout2, the division ratio of the reference divider 11 is controlled as shown by following equation (11). That is, when the relation of fout1=a×fout2 is satisfied, supposing that the reference division ratio in the second frequency synthesizer unit PLL2 is Nref, the reference division ratio in the first frequency synthesizer unit PLL1 is given by following equation.

$$\text{Reference division ratio} = Nref/a \quad (11)$$

According to this second embodiment, when switching the frequency band by switching between the voltage controlled oscillator 2 or 3, the gains of the voltage controlled oscillators 2 and 3, the phase comparator 12, and the charge pump 13 are controlled not to be changed but to keep the same, and the division ratios of the dividers 6 and 7 and the counter 9 are controlled not to be changed but to keep the same, so that only the division ratio of the divider 11 is changed according to the frequency band. For that reason, the switching between the voltage controlled oscillator 2 and 3, and between the plurality of divider 6 and 7 are performed, so that even when the oscillation frequency of the voltage controlled oscillator is switched, the PLL loop gain can always be kept constant by the division ratio control of only the reference divider 11. That makes it possible to always keep constant the PLL characteristic even when the oscillation frequency of the voltage controlled oscillator is switched.

Moreover, according to this second embodiment, although the switching between the plurality of dividers 6 and 7, and between the plurality of voltage controlled oscillators 2 and 3 are individually provided for every frequency band, elements other than those are used in common for all frequency bands, so that a reduction in mounting area and a reduction in power consumption can be achieved.

Third Embodiment

Figure 3:
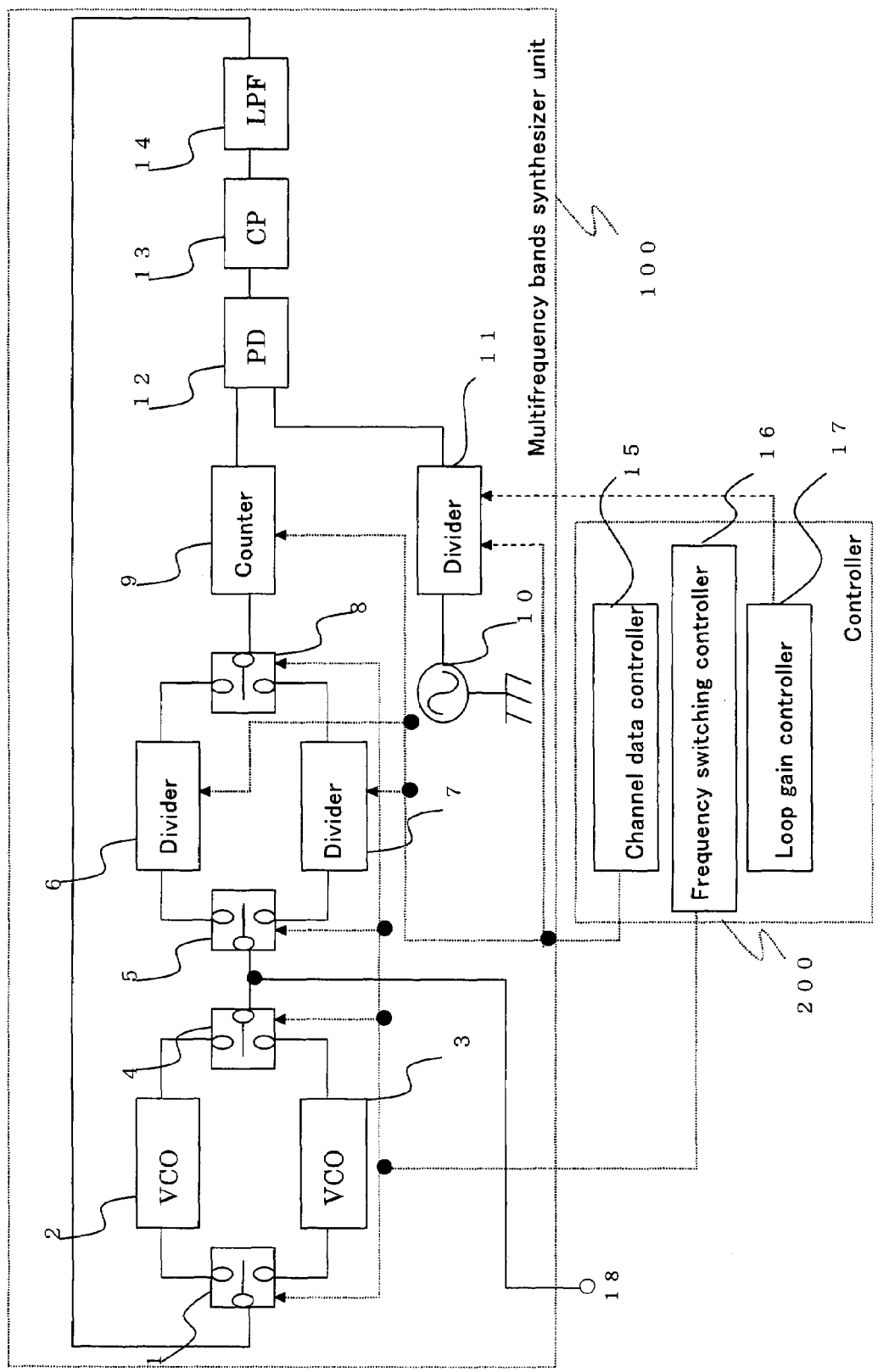
FIG. 3 is a block diagram showing a configuration of a frequency synthesizer according to a third embodiment of the present invention.

Hereafter, a frequency synthesizer according to a third embodiment of the present invention will be explained using FIG. 3.

In this embodiment, a lock frequency and a PLL loop gain control of the frequency synthesizer are set in a manner similar to those of the first or the second embodiment. Moreover, in addition to the configuration of the first or the second embodiment, following relation is held between the voltage controlled oscillators 2 and 3, and the dividers 6 and 7.

When the frequency band of the voltage controlled oscillator 2 is expressed with symbol fvco1 and the frequency band of the voltage controlled oscillator 3 is expressed with symbol fvco2, fvco1>fvco2 is held.

Meanwhile, when a frequency characteristic of the divider 6, a consumed electric current thereof, a frequency characteristic of the divider 7, and a consumed electric current thereof are expressed with symbols fpre1, Ipre1, fpre2, and Ipre2, respectively, a relation shown by following equations is held.

fpre1>fpre2
Ipre1>Ipre2

When an example is given, following relation will be given, for example.

fvco1=2×fvco2
fpre1=2×fpre2
Ipre1=2×Ipre2

Here, when switched to a combination of the voltage controlled oscillator 2 and the divider 6 in synchronizing with the frequency band switching by the frequency switching controller 16, it is supposed to be the first frequency synthesizer unit PLL1. Similarly, when switched to a combination of the voltage controlled oscillator 3 and the divider 7, it is supposed to be the second frequency synthesizer unit PLL2.

According to this configuration, that makes it possible to select the divider 6 or 7 that has the optimal frequency characteristic and consumed electric current characteristic corresponding to the frequency characteristic of each voltage controlled oscillator 2 or 3.

According to this third embodiment, the optimization of the frequency characteristic of the divider can be achieved in switching between the plurality of voltage controlled oscillators and between the plurality of dividers. As a result, a reduction in consumed electric current of the divider can be achieved. Other effects are similar to those of the second embodiment.

Here, the point that a reduction in consumed electric current can be achieved will be specifically explained. Generally, it is required for a divider to have a frequency characteristic which can divide an output frequency of a voltage controlled oscillator. In order to make the frequency characteristic of the divider higher, it is required to reduce a load resistance and increase a consumed electric current of the divider.

For example, when there is a relation that the frequency band of the voltage controlled oscillator 2 is higher than the frequency band of the voltage controlled oscillator 3 by two times, a relation between the divider 6 corresponding to the voltage controlled oscillator 2 and the divider 7 corresponding to the voltage controlled oscillator 3 will be given as follows. The divider 6 of the voltage controlled oscillator 2 having two times higher frequency band requires the frequency characteristic two times higher than that of the divider 7 of the other voltage controlled oscillator 3. Therefore, the consumed electric current of the divider 6 is increased by two times compared with that of the divider 7.

In the above relation, for example, when the voltage controlled oscillator 2 is switched to the voltage controlled oscillator 3, if the only divider 6 (has a frequency characteristic higher than that of the divider 7, and higher consumed electric currents) is used without switching between the dividers, following problems may arise. That is, when switching to the voltage controlled oscillator 7 having a lower frequency characteristic, the frequency characteristic of the divider 6 will be too high, so that an additional consumed electric current may be made to flow.

Therefore, the switching control is performed so that the divider 6 may be used when the voltage controlled oscillator 2 is used, and the divider 7 may be used when the voltage controlled oscillator 3 is used. Thereby, the switching control of the divider can be achieved so that the frequency characteristic and the power consumption characteristic may become optimal corresponding to the switching between the plurality of voltage controlled oscillators. As a result, a reduction in consumed electric current of the frequency synthesizer can be achieved.

Fourth Embodiment

Figure 4:
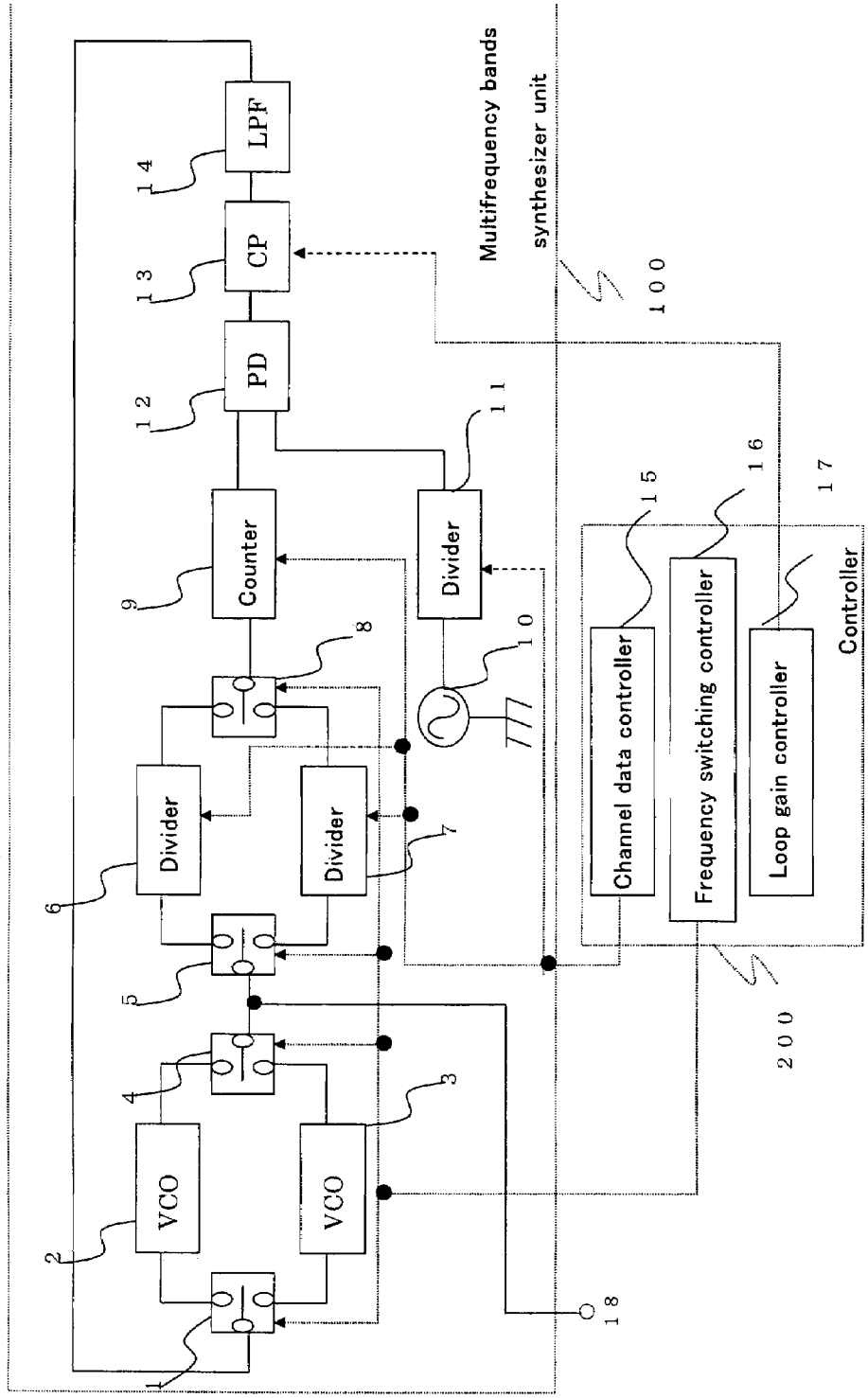
FIG. 4 is a block diagram showing a configuration of a frequency synthesizer according to a fourth embodiment of the present invention.
Figure 5:
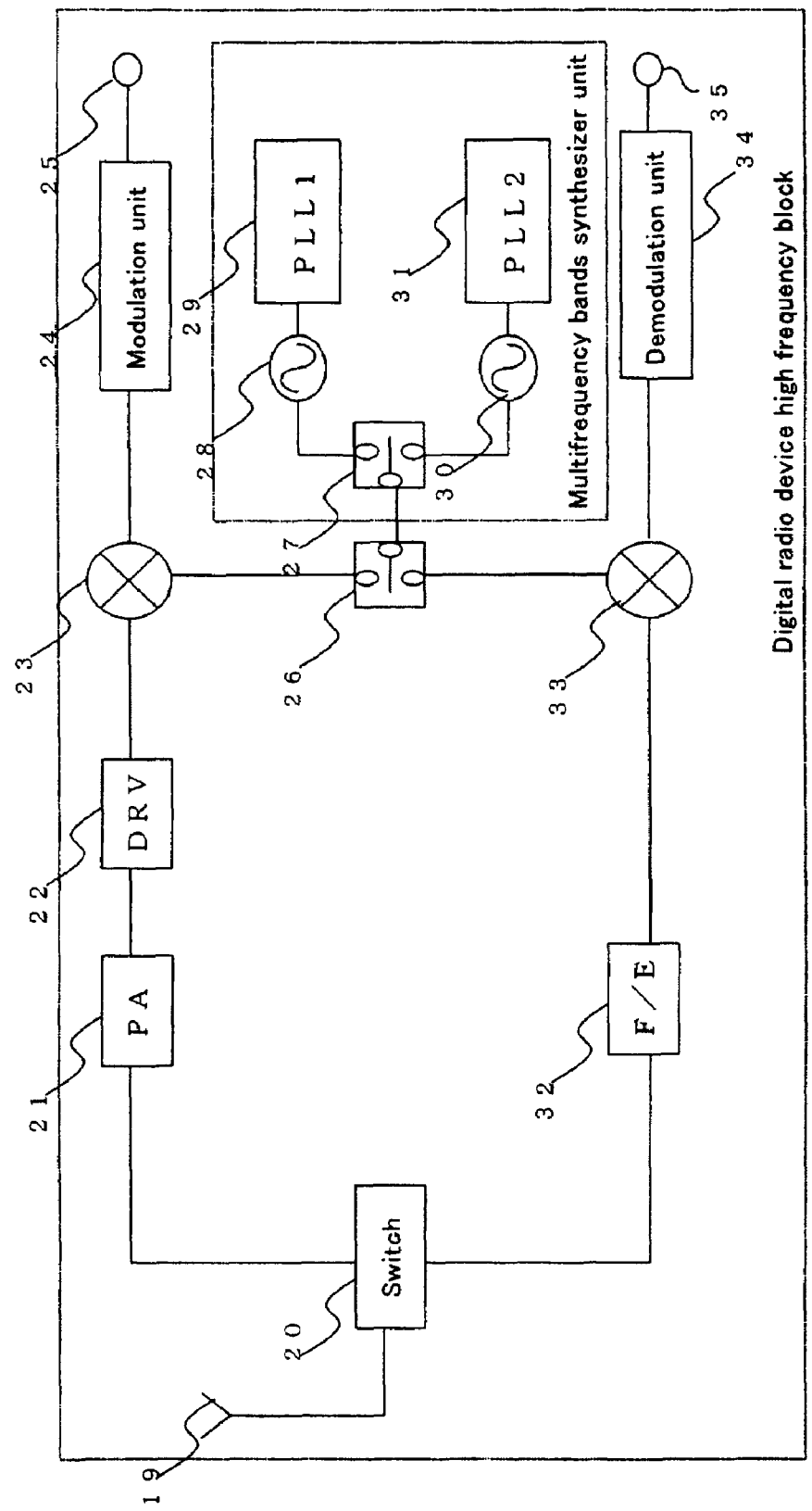
FIG. 5 is a block diagram showing a configuration of the prior art of a digital radio communication system having a frequency synthesizer capable of supporting multifrequency bands.

Hereafter, a frequency synthesizer according to a fourth embodiment of the present invention will be explained using FIG. 4.

In this fourth embodiment, a lock frequency of the frequency synthesizer is set in a manner similar to that of the first embodiment. Further, in addition to the configuration of the first embodiment, the loop gain controller 17 performs a gain control of the charge pump so that the loop gain may be kept constant even when the plurality of voltage controlled oscillators and the plurality of dividers are switched by switching the frequency band.

Here, when a relation of following equations (6), (7), and (8) is held between the oscillation frequency fout1 of the first frequency synthesizer unit PLL1, and the oscillation frequency fout2 of the second frequency synthesizer unit PLL2, the PLL loop gains of the first frequency synthesizer unit PLL1 and the second frequency synthesizer unit PLL2 are expressed with equation (12) and equation (13), respectively.

$$K_1 = (K_{v1} \times K_{PD1} \times K_{CP1})/(a \times M \times N) \quad (12)$$

$$K_2 = (K_{v1} \times K_{PD1} \times K_{CP2})/(M \times N) \quad (13)$$

Here, equations (12) and (13) are transformed into relational expression (14) of the gain of the charge pump so that equation (12) and equation (13) may be constant ($K_1 = K_2$)

$$K_1 = K_2$$

That is, $$\frac{(K_{v1} \times K_{PD1} \times K_{CP1})}{(a \times M \times N)} = \frac{(K_{v1} \times K_{PD1} \times K_{CP2})}{(M \times N)}$$

Therefore, $$K_{CP2} = (1/a) \times K_{CP1} \quad (14)$$

That is, according to equation (8), the charge pump gain of the second frequency synthesizer unit is controlled as shown by equation (14).

According to this fourth embodiment, the plurality of voltage controlled oscillators and the plurality of dividers are switched, so that the oscillation frequency of the voltage controlled oscillator are switched, and a change of the PLL loop gain by switching the division ratio associated with it is compensated by the gain control of the charge pump 13. As a result, the PLL loop gain can always be kept constant. That makes it possible to always keep constant the PLL characteristic even when the oscillation frequency of the voltage controlled oscillator is switched.

In addition, according to this fourth embodiment, although the switching between the plurality of dividers 6 and 7, and between the plurality of voltage controlled oscillators 2 and 3 are individually provided for every frequency band, elements other than those are used in common for all frequency bands, so that a reduction in mounting area and a reduction in power consumption can be achieved.

Incidentally, also in the second through the fourth embodiments described above, in a manner similar to that of the first and the second embodiments, supplying power to a non-selected voltage controlled oscillator among the plurality of voltage controlled oscillators 2 and 3, and supplying power to a non-selected divider among the plurality of dividers 6 and 7 are interrupted, so that a reduction in power consumption can be achieved. Incidentally, even when supplying power to either of the non-selected voltage controlled oscillator or the non-selected divider is only interrupted, a reduction in power consumption can be achieved.

Fifth Embodiment

Hereinafter, a radio communication apparatus according to a fifth embodiment of the present invention will be explained. This radio communication apparatus is composed using the frequency synthesizer in first embodiment. When explaining this specifically, a signal from the voltage controlled oscillator output terminal 18 of the frequency synthesizer in the first embodiment is used as a local oscillation frequency signal of the digital radio communication system capable of supporting the multifrequency bands.

According to this fifth embodiment, a reduction in mounting area of the digital radio communication system capable of supporting the multifrequency bands can be achieved. Other effects are similar to those of the first embodiment.

Incidentally, the frequency synthesizer of the second through the fourth embodiments may be used for the digital radio communication system. In that case, effects similar to those described above may also be obtained.

Incidentally, in the first, the second, and the fourth embodiments, the dividers 6 and 7 are separately provided for every frequency band, but one divider may be used in common for all frequency bands. In this case, a frequency characteristic or the like of the divider to be used in common is designed so as to properly operate for both frequency bands, respectively.

INDUSTRIAL AVAILABILITY

The frequency synthesizer according to the present invention can achieve a reduction in mounting area and a reduction in power consumption, and further, has an effect to provide a frequency synthesizer capable of supporting the multifrequency bands, which has a loop gain characteristic to be kept constant in all frequency bands, so that it is useful to be used for the radio communication apparatus or the like capable of supporting the multifrequency bands.

What is claimed is:

1. A frequency synthesizer, comprising:
   a plurality of voltage controlled oscillators which are individually provided according to a plurality of frequency bands and oscillate at a frequency corresponding to an external voltage;
   a first frequency-dividing unit which divides an output signal of said plurality of voltage controlled oscillators;
   a reference oscillator provided in common for said plurality of frequency bands;
   a phase comparison unit which is provided in common for said plurality of frequency bands, and performs a phase comparison between a signal obtained from said first frequency-dividing unit and a signal obtained from said reference oscillator to output an error signal;
   a low pass filter which is provided in common for said plurality of frequency bands, and integrates an output signal of said phase comparison unit to provide it to said voltage controlled oscillator as said external voltage;
   a voltage controlled oscillator selection unit which selects any one of said plurality of voltage controlled oscillators associated with a selection of the frequency band; and
   a controlling unit which performs a gain control of a frequency synthesizer loop in synchronizing with a selection change of said plurality of voltage controlled oscillators so that a gain characteristic of said frequency synthesizer loop comprised of any one of said plurality of voltage controlled oscillators, said first frequency-dividing unit, said phase comparison unit, and said low pass filter may become constant regardless of the selection change of said plurality of voltage controlled oscillators.

2. The frequency synthesizer according to claim 1, further comprising a frequency-dividing unit selecting unit, wherein a plurality of said first frequency-dividing units are provided corresponding to said plurality of frequency bands, and any one of said plurality of first frequency-dividing units is selected associated with the selection of said frequency band by the frequency-dividing unit selecting unit.

3. The frequency synthesizer according to claim 1, comprising a second frequency-dividing unit between said reference oscillator and said phase comparison unit.

4. The frequency synthesizer according to claim 1, wherein as a gain control of said frequency synthesizer loop, said controlling unit performs a gain control of at least either of said plurality of voltage controlled oscillators or said phase comparison unit.

5. The frequency synthesizer according to claim 1, wherein a charge pump is provided between said phase comparison unit and said low pass filter, and said controlling unit performs a gain control of said charge pump as the gain control of said frequency synthesizer loop.

6. The frequency synthesizer according to claim 3, wherein said controlling unit performs a division ratio control of said first frequency-dividing unit as the gain control of said frequency synthesizer loop, and controls a division ratio of said second frequency-dividing unit so as to compensate a frequency change of the output signal of said plurality of voltage controlled oscillators associated with the division ratio control of said first frequency-dividing unit.

7. The frequency synthesizer according to claim 3, wherein as the gain control of the frequency synthesizer loop, said controlling unit controls the division ratio of said second frequency-dividing unit in a state of keeping constant gains of said plurality of voltage controlled oscillators and said phase comparison unit, and the division ratio of said first frequency-dividing unit constant, so that it sets frequencies of the output signals of said plurality of voltage controlled oscillators to predetermined frequencies, respectively, while keeping constant the gain characteristic of said frequency synthesizer loop.

8. The frequency synthesizer according to claim 2, wherein said voltage controlled oscillator selection unit comprises a first selector which selectively provides an output of said low pass filter to said plurality of voltage controlled oscillators, and a second selector which selectively outputs an output of said plurality of voltage controlled oscillators, and said frequency-dividing unit selecting unit comprises a third selector which selectively provides an output of said second selector to said plurality of first frequency-dividing units, and a fourth selector which selectively outputs an output of said plurality of first frequency-dividing units; and
   a power supply to a non-selected voltage controlled oscillator among said plurality of voltage controlled oscillators and a power supply to a non-selected first frequency-dividing unit among said plurality of first frequency-dividing units are interrupted.

9. The frequency synthesizer according to claim 2, wherein said plurality of first frequency-dividing units have a frequency characteristic according to a shared frequency band among said plurality of frequency bands, and power consumption varies to be higher when the shared frequency band becomes higher or to be lower when it becomes lower.

10. The frequency synthesizer according to claim 2, wherein a power supply to a non-selected first frequency-dividing unit among said plurality of first frequency-dividing units is interrupted.

11. A digital radio communication system provided with the frequency synthesizer according to claim 1.

* * * * *

UNITED STATES PATENT AND TRADEMARK OFFICE
CERTIFICATE OF CORRECTION

PATENT NO.         : 7,391,841 B2                                    Page 1 of 1
APPLICATION NO. : 11/041888
DATED              : June 24, 2008
INVENTOR(S)        : Hisashi Takahashi It is certified that error appears in the above-identified patent and that said Letters Patent is hereby corrected as shown below:

On the title page: Item (30) for the Foreign Application Priority Data is not included and should read:

(30) January 26, 2004   (JP) …………………….. 2004-017174

Signed and Sealed this

Twenty-third Day of September, 2008

JON W. DUDAS
*Director of the United States Patent and Trademark Office*